(12) United States Patent
Dalby et al.

(10) Patent No.: US 7,653,442 B2
(45) Date of Patent: Jan. 26, 2010

(54) COMMUNICATION SYSTEM COMPRISING A CONTROLLER SYSTEM AND A MASTER CONTROL MEANS CONNECTED VIA A MULTIPOLE CONNECTION MEANS

(75) Inventors: Michael Dalby, Staffordshire (GB); Mark Densley, Littleton, CO (US)

(73) Assignee: Norgren Limited (GB)

( * ) Notice: Subject to any disclaimer, the term of this patent is extended or adjusted under 35 U.S.C. 154(b) by 44 days.

(21) Appl. No.: 11/813,496

(22) PCT Filed: Dec. 23, 2005

(86) PCT No.: PCT/GB2005/005074

§ 371 (c)(1),
(2), (4) Date: Dec. 31, 2007

(87) PCT Pub. No.: WO2006/072770

PCT Pub. Date: Jul. 13, 2006

(65) Prior Publication Data

US 2008/0208366 A1  Aug. 28, 2008

(30) Foreign Application Priority Data

Jan. 7, 2005  (GB) ................. 0500223.3

(51) Int. Cl.
G05B 19/18 (2006.01)
G05B 11/01 (2006.01)
G05B 13/02 (2006.01)
G05D 7/00 (2006.01)
G05D 11/00 (2006.01)

(52) U.S. Cl. ................ 700/3; 700/18; 700/53; 700/282; 709/208; 709/209; 709/210; 709/211; 710/110; 340/2.24; 340/2.26; 340/855.1; 73/1.16

(58) Field of Classification Search .............. 700/3, 700/18, 53, 282; 709/208–211; 710/110; 702/45–49; 73/1.16–1.36; 137/2–12; 340/2.24, 340/2.26, 854.9, 855.1
See application file for complete search history.

(56) References Cited

U.S. PATENT DOCUMENTS 3,591,850 A  7/1971  Holm (Continued)

FOREIGN PATENT DOCUMENTS

DE  19629868 A1  2/1998

(Continued)

OTHER PUBLICATIONS

"Fieldbus Systems", Machine Design, Penton Media, Cleveland, OH, US, vol. 67, No. 11, Jun. 15, 1995, p. 172, XP000519401, ISSN: 0024-9114.

Primary Examiner—Ramesh B Patel
(74) Attorney, Agent, or Firm—The Ollila Law Group LLC

(57) ABSTRACT

A communication system is provided that includes a controller system (1), a master control (2) and at least one slave control (3). The controller system and the master control (2) are connected via a multipole connection (4). The master control (2) is adapted to receive a multipole signal via the multipole connection (4) and output an addressed signal to at least one slave control (3) via an addressable connection (7, 17). This application also discloses a method of controlling a plurality of fluid flow controls using an output (40) comprising an actuation signal arrangement (41, 41') and an actuator (42, 42') associated with each fluid flow control.

27 Claims, 2 Drawing Sheets

U.S. PATENT DOCUMENTS

| | | | |
|---|---|---|---|
| 4,774,656 A | 9/1988 | Quatse et al. | |
| 4,864,531 A | 9/1989 | Quatse et al. | |
| 5,017,051 A | 5/1991 | Kowalik et al. | |
| 5,017,855 A * | 5/1991 | Byers et al. | 318/811 |
| 5,128,855 A * | 7/1992 | Hilber et al. | 700/3 |
| 5,226,494 A | 7/1993 | Rubbo et al. | |
| 5,249,140 A * | 9/1993 | Kessler | 700/3 |
| 5,331,619 A * | 7/1994 | Barnum et al. | 700/3 |
| 5,343,963 A | 9/1994 | Bouldin et al. | |
| 5,458,048 A * | 10/1995 | Hohner | 91/459 |
| 5,579,283 A | 11/1996 | Owens et al. | |
| 5,931,902 A * | 8/1999 | Shindoh et al. | 709/213 |
| 6,021,095 A | 2/2000 | Tubel et al. | |
| 6,021,356 A * | 2/2000 | Chang | 700/3 |
| 6,053,198 A | 4/2000 | Atkin et al. | |
| 6,055,213 A | 4/2000 | Rubbo et al. | |
| 6,185,217 B1 * | 2/2001 | Ando et al. | 370/403 |
| 6,238,291 B1 * | 5/2001 | Fujimoto et al. | 463/44 |
| 6,414,905 B1 | 7/2002 | Owens et al. | |
| 6,483,342 B2 * | 11/2002 | Britton et al. | 326/39 |
| 6,590,494 B2 | 7/2003 | Gohr | |
| 6,734,020 B2 * | 5/2004 | Lu et al. | 436/55 |
| 7,307,519 B2 * | 12/2007 | Yanagida et al. | 340/538 |
| 7,369,902 B2 * | 5/2008 | Nakayama et al. | 700/3 |
| 2003/0050989 A1 * | 3/2003 | Marinescu et al. | 709/208 |
| 2003/0220961 A1 | 11/2003 | Imai et al. | |
| 2004/0117537 A1 | 6/2004 | Vandensande | |
| 2004/0213676 A1 | 10/2004 | Phillips et al. | |
| 2005/0114742 A1 * | 5/2005 | Takenobu | 714/56 |

FOREIGN PATENT DOCUMENTS

| | | |
|---|---|---|
| EP | 0608245 B1 | 10/1996 |
| EP | 0871130 A2 | 10/1998 |
| EP | 1100152 | 5/2001 |
| EP | 1111484 A2 | 6/2001 |
| WO | WO2004/070481 A | 8/2004 |
| WO | WO2004/092895 A | 10/2004 |
| WO | WO2005/001699 A | 1/2005 |

* cited by examiner though of the invention.

COMMUNICATION SYSTEM COMPRISING A CONTROLLER SYSTEM AND A MASTER CONTROL MEANS CONNECTED VIA A MULTIPOLE CONNECTION MEANS

CROSS-REFERENCE TO RELATED APPLICATIONS

This is a National Stage entry of International Application No. PCT/GB2005/005074, with an international filing date of Dec. 23, 2005, which claims priority of Great Britain patent application No. 0500223.3, filed Jan. 7, 2005, entitled "Communication System".

This invention relates to a communication system and in particular to a communication system for fluid flow control valves.

It is now commonplace in, for example, production machinery for all of the pneumatic or hydraulic equipment to be controlled by respective directional control valves that are usually mounted on one and the same 'valve island'. It will be appreciated that the term 'valve island' is intended to include devices such as 'valve manifolds' and the like. The valves in the valve islands are usually controlled by solenoids that receive electrical signals to cause them to actuate the associated valve. The valve islands are connected to a controller system, via a communication system, which sends the signals to control the operation of the valves on the valve island.

There are two main types of communication system in common usage; multipole and fieldbus. In a multipole communication system, each valve in the valve island has a separate communication line effectively connecting it directly to the controller system. Thus, a 25-pin or other common connector links the controller system and the valve island and each pin provides the control signal for a different valve on the valve island. Thus, the multipole system is easy to understand and use. However, as a separate line is required for each valve to be controlled a complex multipole-based system can be expensive with regard to the wiring requirements and the number of outputs at the controller system. Further, it can be confusing when attempting to identify faults.

The other type of communication system is an address-based fieldbus system. Here, the valve islands are connected together to form a network often using a two-wire medium. The controller system sends instructions that are addressed to a particular valve island and a control system on the island interprets the instructions and thus actuates the appropriate valve. Although the fieldbus control system provides more flexibility, it can appear complex due to the programming required to administer the system.

According to the present invention we provide a communication system comprising a controller system, a master control and at least one slave control, the controller system and the master control being connected via a multipole connection, the master control being adapted to receive a multipole signal via the multipole connection and outputting an addressed signal to the at least one slave control system via an addressable connection.

This is advantageous as the system is easy to understand and set up, yet has the advantages of an addressable communication system such as the fieldbus system described above. In particular, if the system controls valves, the valves may be distributed over the "master" valve island and several "slave" valve islands (with the associated control, and all of them can be controlled by the controller system via a single multipole connection. Thus, the user can program the controller system as if the system is a multipole system, while the master control interprets the instructions and can relay them to the appropriate slave valve island control, as required.

Preferably the controller system is a programmable logic controller (PLC).

Preferably the master and slave controls control fluid flow control valves. In particular, the master and slave controls may be associated with valve islands and thus they control the solenoid operated valves thereon.

Preferably further slave control systems are connected to the communication system via addressable connections in a chain-like manner.

The addressable connections may be based on a Local Interconnect Network (LTN) standard. The LIN standard is a single wire communications standard between a master system and at least one slave system. Each slave system needs minimal configuration to operate which, when combined with the single wire medium, make it simple and cost efficient. Preferably, the addressable connection is based on the Controller Area Network (CAN) standard. Most preferably, the addressable connection is based on a RS485 standard. Thus, the master and slave controls may include transceivers to enable them to communicate using the chosen protocol of the addressable connection.

Preferably the multipole connection comprises a 25-pin connector or a 44-pin connector. However, it will be appreciated that the multipole connector may be some other industrially accepted connector.

Preferably, the master control comprises a microprocessor. The slave control may also comprise a microprocessor.

Preferably, the master control includes a diode array that derives power for the master control, and for the actuation of any devices that it controls, from the multipole input signal. Preferably, the slave control derives power from the addressable connection.

The master control preferably has a signal conditioner to ensure that the signals received from the multipole connection are in a suitable form, and within a particular voltage range, for being received by the microprocessor of the slave control.

Preferably the master and slave controls have outputs for actuating the required valve. The outputs may comprise an output array de-multiplexer. Alternatively, the output may be adapted to use a serial signal from the control to control the appropriate valve. This configuration of the output forms the subject of the second aspect of the invention.

As the invention allows for various numbers of valves to be spread over a master valve island and several slave valve islands, for example, the system of the first aspect of the invention requires a flexible system of actuating specific valves. As the control comprises a microprocessor it is advantageous if it can output a serial signal to actuate a valve on the valve island.

According to a second aspect of the invention, we provide a method of controlling a plurality of fluid flow controls using an output comprising an actuation signal arrangement and an actuator associated with each fluid flow control, the method comprising the steps of;

applying a pre-actuation signal to the actuation signal arrangement;

applying a clock signal to the actuation signal arrangement such that it stores the first pre-actuation signal and can receive further pre-actuation signals;

repeating the above steps a predetermined number of times;

applying an actuation signal to the actuator to cause a fluid flow control to actuate.

Thus, the order of pre-actuation signals and the number of times the clock signal is applied determines which fluid flow control is actuated when the actuation signal is applied. This is advantageous as further valves can be added and the microprocessor need only alter the number of times the first two steps are performed.

Preferably, the actuation signal arrangement comprises a series of flip-flops, each being associated with a fluid flow control. Preferably, the flip-flops are "D" type flip-flops.

Preferably, the actuator comprises a latch. Preferably, each fluid flow control comprises a solenoid operated valve. Preferably, the latch is a "D" type latch.

Preferably, the output from one actuation signal arrangement forms the input of the next actuation signal arrangement.

Preferably, the above method can be used in a configuration mode wherein a single pre-actuation signal is applied and then only clock signals, such that the number of actuation signal arrangements and actuators can be determined. Thus, as the control is able to determine when the actuation signal arrangement has received all the pre-actuation signals it can, the number of fluid flow controls can be determined from the number of clock cycles. Preferably, the output of the final actuation signal arrangement is connected to the microprocessor.

There now follows by way of example only a detailed description of the present invention with reference to the accompanying drawings in which.

Figure 1:
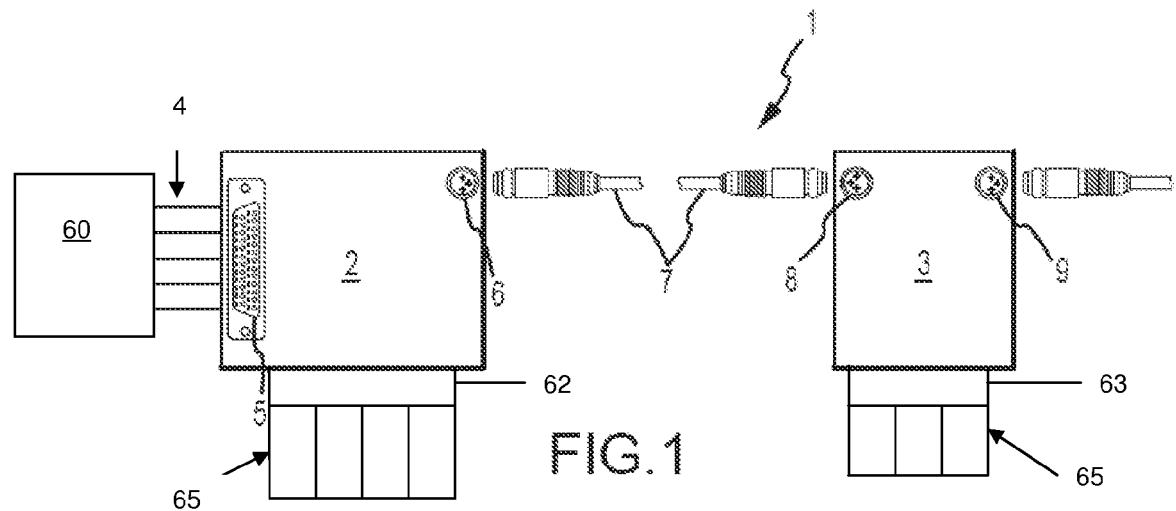
FIG. 1 is a diagram showing the arrangement of the communication system of the invention.

A communication system 1 according to the invention is represented in FIG. 1. The communication system 1 comprises a master control 2 that receives control signals from a controller system 60 and a slave control 3. The master control 2 receives signals from the controller system 60 via multipole connection 4. The multipole connection 4 shown in FIG. 1 uses a 25-pin D-type connector 5. The master control 2 is in communication with each slave control 3 via an addressable connection in the form of a sub-bus, which operates in accordance with the RS485 standard/protocol. The master control 2 has a master sub-bus connector 6 for connecting it, via a sub-bus cable 7, to a slave sub-bus connector 8 on the slave control 3. Thus, the master control 2 forms the master node on a sub-bus (with the cable 7 forming part of the bus) and the slave control 3 forms the slave node on the bus. The slave control system 3 has a further sub-bus connector 9 for connecting it to a further slave control (not shown).

It will be appreciated that the addressable connection may be based on a sub-bus that operates in accordance with other standards such as CAN or LIN depending upon the application of the system.

It will also be appreciated that additional slave controls may be added in a "chain-like" arrangement. The number of slave controls that may be added is limited by the electrical power that can be supplied via the multipole connection 4 or through subsequent connections, as it is the power received through the connection 4 that allows the subsequent control to operate. However, the master or slave control may be adapted to receive their own power supply.

The master control 2 and the slave control 3 are associated with valve islands 62, 63, respectively. Thus, the control 2, 3 control solenoid-actuated pneumatic valves, generally represented by 65, mounted on the valve island 62, 63. The pneumatic valves 65 may be used to actuate production machinery or the like.

Figure 2:
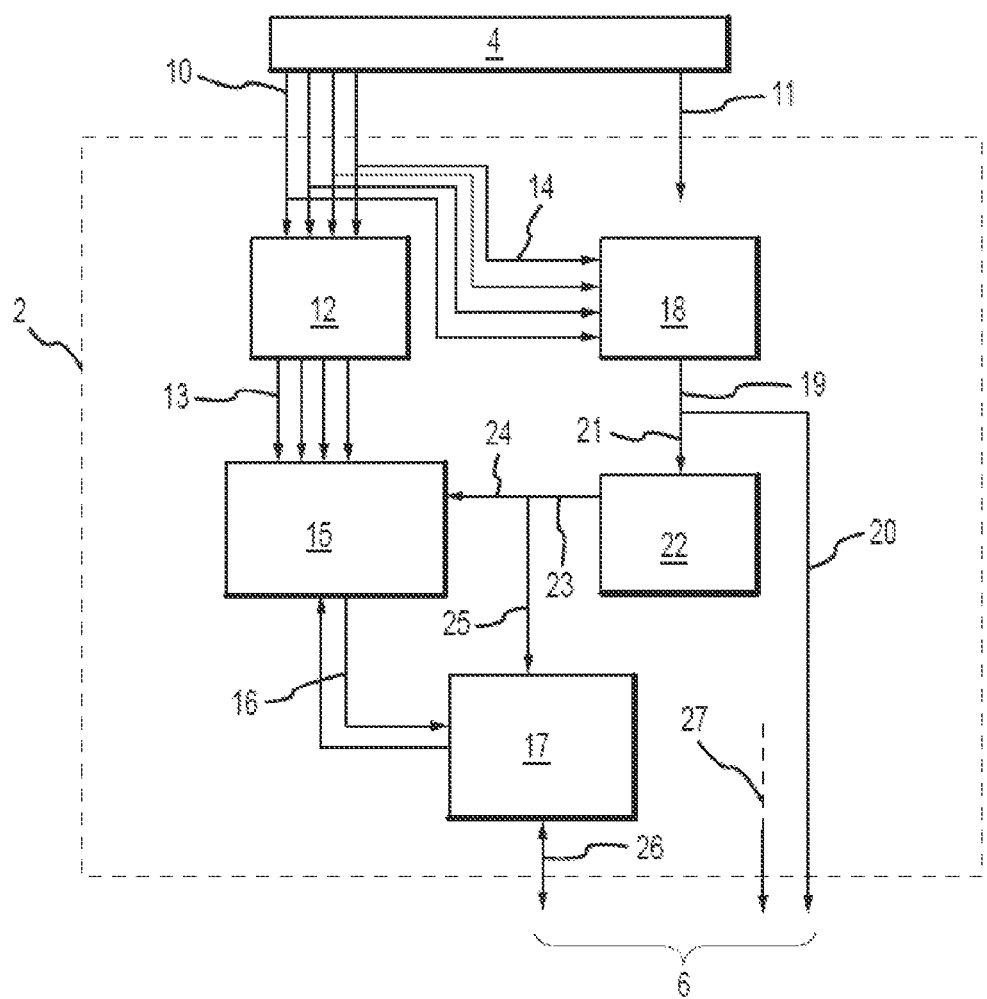
FIG. 2 is a diagram of the master control.

FIG. 2 shows a block diagram of the master control 2, which is represented by the dashed lines. The diagram shows how the multipole signal 4 is used and how the signals are output to the sub-bus connector 6. The multipole signal 4 received by the master control 2 comprises twenty-five pins that provide the control signals 10 and a common 0 volts 11, which provides a ground for the system. The control signals 10 are received by a signal conditioner 12, which prepares the signals 10 for being received by a microprocessor 15. In particular, the signal conditioner 12 reduces the voltage of the signals from typically 24 volts to a voltage that can be reliably interpreted by the microprocessor 15.

The signal conditioner outputs a signal 13 that is received by the microprocessor 15. The microprocessor 15 interprets the signal and determines whether the valve 65 to be actuated is located on the valve island 62, 63 with which the master control 2 is associated or with which the slave control 3 is associated. If it is determined that the valve 65 to be actuated is controlled by the slave control 3, the microprocessor 15 prepares the appropriate addressed signal for transmission on the sub-bus 7 of the addressable connection. The output signal 16 is a serial signal to a sub-bus transceiver 17.

The sub-bus transceiver 17 modifies the signal 16 in accordance with the protocol/standard of the sub-bus (RS485) and then outputs the addressed data signal for transit over the sub-bus at 26. The output 26 is connected to the sub-bus connector 6 for transmitting along the sub-bus cable 7.

The control signals 10 split as they enter the master control 2 and as well as being received by the signal conditioner 12, they are received by a diode array 18. The control signals 10 are used to provide power for the components 15, 17 of the master control 2 and for transmission to the further slave control 3, via the sub-bus cable 7. The outputs 14 are received by a diode array 18. The diode array 18 combines the control signals 10 in the nature of an OR-gate to a single 24 volt power output 19. The 24 volts output 19 branches into a first line 20 and a second line 21. The first line 20 connects to the sub-bus 25 connector 6 to provide power for the subsequent slave control 3. The second line 21 is received by a voltage regulator 22 that regulates the 24 volt input 21 to a voltage suitable for operating the logic of the microprocessor 15 and the sub-bus transceiver 17. Thus, the voltage regulator 22 has an output 23 that branches into separate lines 24, 25 to supply power to the microprocessor and sub-bus transceiver respectively.

The outputs from the master control 2 are output via the sub-bus connector 6. Thus, there are three separate signals that are passed along cable 7; the 24 volt output 20 from the diode array 18, a common 0 volt output 27 derived from the input 11 and the data signal 26. Although only one pin is shown for the data signal 26, there will be as many pins as required by the communication standard used for the addressable connection.

Figure 3:
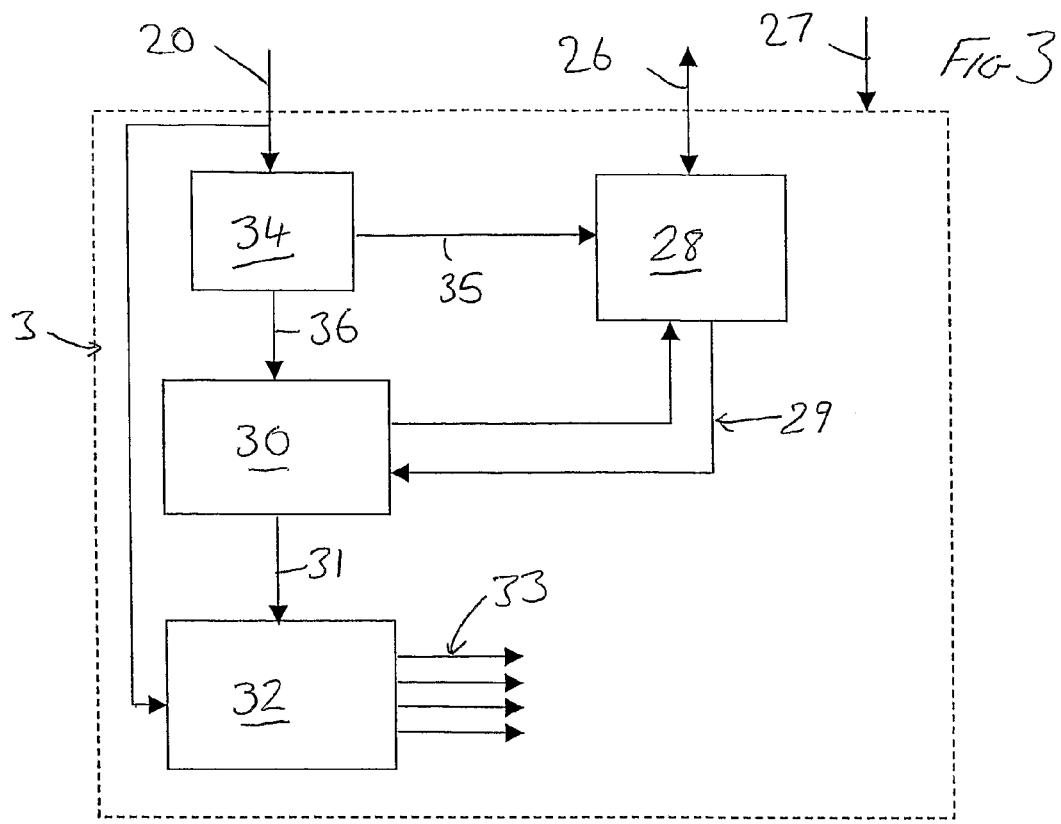
FIG. 3 is a diagram of the slave control.

A diagram of the slave control 3 is shown in FIG. 3. The slave control 3 receives the three signals 20, 26 and 27 via the cable 7 and connector 8. The data signal 26 is received by a sub-bus transceiver 28, which interprets the signal in accordance with the RS485 standard/protocol. The sub-bus transceiver 28 outputs the signal at 29, which is received by a microprocessor 30. The microprocessor interprets the signal and if required passes instructions 31 to output 32. Thus, the microprocessor interprets the serial data signal 29 from the subbus transceiver 28 and, if required, outputs a signal 33 via the output array 32. The signal 33 from the output 32 controls the appropriate solenoid valve 65 on the valve island 63 with which the slave control 3 is associated.

The 24 volts input 20 splits when it enters the slave control 3, one line being received by a voltage regulator 34 and the other by the output 32. The output uses the 24 volts to actuate the solenoids on the valve island 63. The voltage regulator 34, as in the master control 2, has outputs 35 and 36 to provide power for the sub-bus transceiver 28 and the microprocessor 30, respectively.

The microprocessor 30 of the slave control 3 has two-way communication with the sub-bus transceiver 28 and thus further slave controls can be attached to data line 26 (the sub-bus) via the second sub-bus connector 9 (shown in FIG. 1). The second sub-bus connector 9 is connected to the sub-bus transceiver 28.

In use, the controller system 60 passes a multipole signal 4 to the master control 2 to actuate a specific valve 65 on either of the valve islands 62, 63 associated with the particular control 2, 3. The signal conditioner 12 receives the multipole control signals 10 and outputs the conditioned signals 13. The microprocessor 15 of the master control 2 receives power from the voltage regulator 22 and receives the signals 13. The microprocessor 15 then, in accordance with its program, determines whether the valve 65 to be actuated is located on the valve island 62 with which it is associated. If so, it passes the appropriate signal to output (not shown). If the valve 65 is determined to be associated with the slave control 3, the microprocessor prepares an addressed signal 16 and passes it to the sub-bus transceiver 17. The sub-bus transceiver 17 transmits it along the sub-bus cable 7 to the slave control 3 in accordance with the protocol of the sub-bus. The signal is received by the sub-bus transceiver 28 of the slave control 3. The transceiver 28 interprets and then outputs signal 29 to the microprocessor 30 of the slave control 3. The microprocessor 30 processes the signal 29 in accordance with its program to determine if the signal is addressed to it and thus if a valve 65 connected to the slave control 3 should be actuated. If so, the appropriate signal 31 is sent to the output 32, which causes the appropriate valve 65 to be actuated. If the microprocessor determines that the signal 29 is not addressed to it, it is ignored.

The signal 26 is also relayed to any subsequent slave control 3 by the sub-bus transceiver 28, via the further sub-bus connector 9, and any further slaves (not shown) processes the signal as described above.

The microprocessors 15, 30 may be pre-programmed or the user, via a RS232 interface or Bluetooth, may set the program, for example. Thus, the user may be able to program which valve or combination of valves are actuated in response to each multipole input 10.

Thus, many valve islands can be controlled from a single 25-pin (or other standard connector) multipole based system. In practice, it is common for a single valve island not to include a complete quota of valves thereon and therefore not all of the pins would be in use. Thus, with a standard multipole system a user may require several valve islands each connected by separate multipole connectors. The present invention allows the valves to be spread over a master and several slave valve islands that are controlled via the master control. This reduces the amount of cabling required and the number of outputs at the controller system. Therefore, the system of the invention has the simplicity and ease of use of a multipole system, while having the flexibility of a Fieldbus system.

Figure 4:
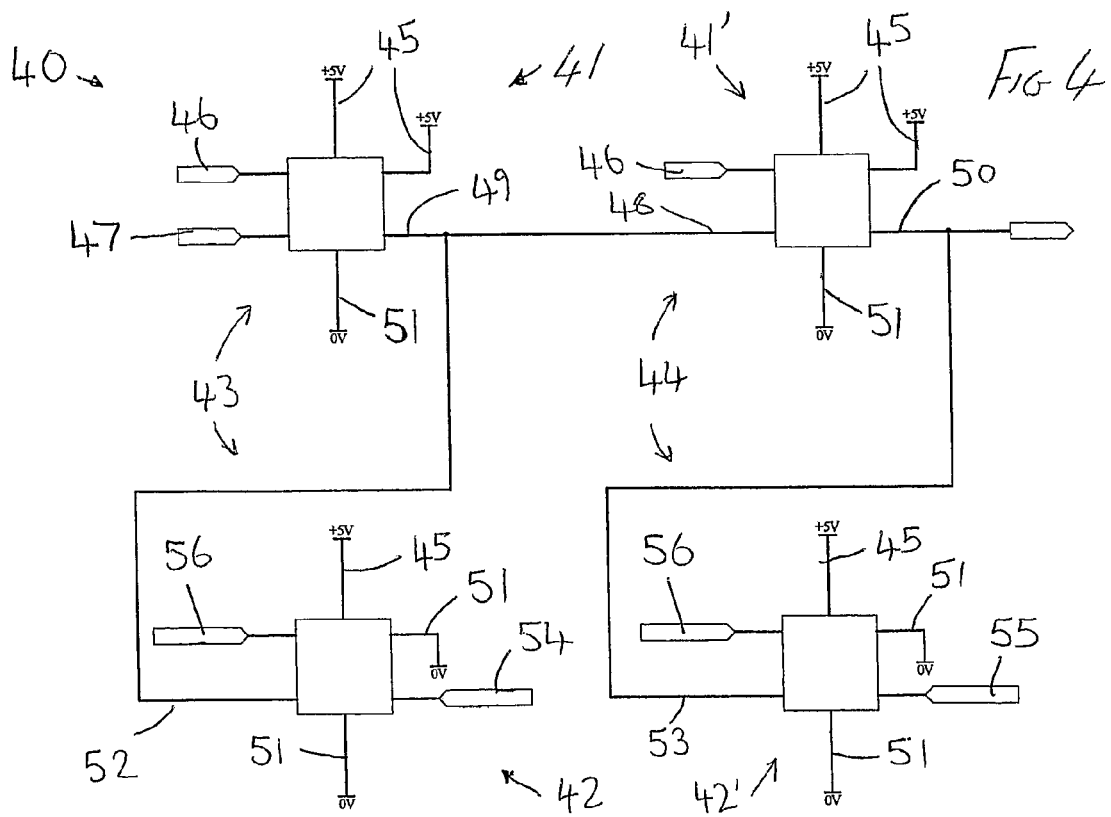
FIG. 4 is a diagram of the output.

An output 40 (as shown in FIG. 4) comprises actuation signal arrangement 41, 41' and actuator 42, 42'. Each pair 43, 44 of actuation signal arrangements 41, 41' and actuators 42, 42' are associated with a fluid flow control in the form of a solenoid operated valve 65. The actuation signal arrangement 41, 41' comprise a "D" type flip-flop having a power supply line 45, an edge-triggered clock signal input 46, a pre-actuation signal data input 47, 48, a pre-actuation signal data output 49, 50 and a 0 volts line 51. The data outputs 49, 50 branch to connect to the associated actuator 42, 42'.

The actuator 42, 42' comprise a "D" type latch. Inputs 52 and 53 to the latches 42, 42' are from outputs 49 and 50 respectively. The latches 42, 42' also have a power supply line 45 and 0 volts line 51. The latches 42 and 42' are connected to the valves by output lines 54 and 55. The latches 42, 42' also have inputs 56 for receiving an actuation signal. Thus, the output 40 is of the form of a 2-bit serial latch.

The clock signal input 46, the pre-actuation signal data input 47 and the edge-triggered actuation signal input 56 are all received from the master or slave microprocessor 15, 30. The above inputs are digital and thus take the form of either a "1" or a "0".

In use, the sequence in which the above signals are applied determines which valves are actuated. For example, to actuate the second valve in the chain a pre-actuation signal of "1" is applied to the input 47 at the same time as a clock pulse at input 46. As will be appreciated, this causes the pre-actuation signal of "1" to appear at output 49 and therefore form the input of the second flip-flop 41' at input 48. During the second clock cycle, the pre-actuation signal is "0". Thus, after the second clock pulse at input 46, there is a pre-actuation signal of "0" at output 49 and the pre-actuation signal of "1" now appears at output 50.

The microprocessor 15, 30 now outputs an actuation signal to input 56. As the outputs 49 and 50 form the inputs 52 and 53, after the actuation signal, a "0" will appear at valve output 54 and a "1" will appear at valve output 55. Thus, the first valve in the chain will not be actuated, as it will receive a "0" signal, while the second valve in the chain will be actuated, as it receives the pre-actuation signal of "1".

If another valve is added, the pre-actuation signal data input of the additional flip-flop/latch pair can be connected to the output 50. Further valves can be added in a similar manner. Thus, it will be appreciated that this method can be used to actuate any valve in the chain of valves or any combination thereof, as the pre-actuation signals are fed into the chain at input 47 and then "passed through" the flip-flops by the clock signal edge. Once the clock signal has cycled the required number of times and the pre-actuation signals form the input of the appropriate latch 42, 42', the actuation signal is applied to pass the signals to the appropriate valve.

This method may also be used in a configuration mode to allow the microprocessor to determine how many valves are connected to the valve island with which it is associated. At the end of the chain of flip-flop/latch pairs 43, 44 the output 50 returns to the microprocessor. Using the example as shown in FIG. 4, during a configuration mode a pre-actuation signal of "1" is applied at input 47 during the first clock cycle at input 46. After the first clock cycle the pre-actuation signal is kept as "0". The microprocessor 15, 30 then counts the number of clock cycles applied at inputs 46 until the pre-actuation signal of "1" returns to it. The number of valves can thus be determined by counting the number of clock pulses applied during this configuration mode.

Further, during the configuration mode the microprocessor 30 of each slave control 3 may pass the information of the number of valves 65 associated with it back to the master control 2. Thus, the master control can then determine which valve is attached to which slave control 3 and therefore address the appropriate one in response to the multipole signals 10.

The invention claimed is:

1. A communication system (1) comprising a controller system (60), a master control (2) and at least one slave control (3), the controller system (60) and the master control (2) being connected via a multipole connection (4), the master control (2) being adapted to receive a multipole signal via the multipole connection (4) and outputting an addressed signal to the at least one slave control(3) via an addressable connection (7, 17).

2. The communication system according to claim 1, in which the controller system is a programmable logic controller (PLC).

3. The communication system according to claim 1, in which the master and slave controls (2, 3) control fluid flow control valves.

4. The communication system according to claim 1, in which the master and slave controls (2, 3) are associated with valve islands (62, 63) and control solenoid operated valves (65) located thereon.

5. The communication system according to claim 1, in which further slave controls (3) are connected to the communication system via addressable connections (7, 17) in a chain-like manner.

6. The communication system according to claim 1, in which the addressable connection (7, 17) is based on a Local Interconnect Network (LIN) standard.

7. The communication system according to claim 1, in which the addressable connection (7, 17) is based on the Controller Area Network (CAN) standard.

8. The communication system according to claim 1, in which the addressable connection (7, 17) is based on a RS485 standard.

9. The communication system according to claim 1, in which the master and slave controls (2, 3) include a transceiver (28) to enable them to communicate using the protocol of the addressable connection (7, 17).

10. The communication system according to claim 1, in which the multipole connection (4) comprises a 25-pin connector.

11. The communication system according to claim 1, in which the multipole connection (4) comprises a 44-pin connector.

12. The communication system according to claim 1, in which the master control (2) comprises a microprocessor (15).

13. The communication system according to claim 1, in which the slave control (3) comprises a microprocessor (30).

14. The communication system according to claim 1, in which the master control (2) includes a diode away (18) that derives power for the master control (2), and for the actuation of any devices that it controls, from the multipole input signal (10).

15. The communication system according to claim 1, in which the at least one slave control (3) derives power from the addressable connection (7, 17).

16. The communication system according to claim 12, in which the master control (2) has a signal conditioner (12) to ensure that the signals received from the multipole connection (4) are in a suitable form for receipt by the microprocessor (15) of the slave control.

17. The communication system according to claim 1, in which the master and slave controls (2, 3) have outputs (32) for actuating the required valve.

18. The communication system according to claim 17, in which the output (32) comprises an output away de-multiplexer.

19. The communication system according to claim 17, in which the output (32) is adapted to use a serial signal from the master or slave control to control the appropriate valve.

20. A method of controlling a plurality of fluid flow control using an output (40) comprising an actuation signal arrangement (41, 41') and an actuator (42, 42') associated with each fluid flow control, the method comprising the steps of;
applying a pre-actuation signal to the actuation signal arrangement (41, 41');
applying a clock signal to the actuation signal arrangement (41, 41') such that it stores the first pre-actuation signal and can receive further pre-actuation signals;
repeating the above steps a predetermined number of times;
applying an actuation signal to the actuator (42, 42') to cause a fluid flow control to actuate.

21. The method according to claim 20, in which the actuation signal arrangement (41, 41') comprises a series of flip-flops, each being associated with a fluid flow control.

22. The method according to claim 21, in which the flip-flops (41, 41') are "D" type flip-flops.

23. The method according to claim 20, in which the actuator (42, 42') comprises a latch.

24. The method according to claim 23, in which the latch (42, 42') is a "D" type latch.

25. The method according to claim 20, in which each fluid flow control comprises a solenoid operated valve.

26. The method according to claim 20, in which the output (49) from the actuation signal arrangement (41) forms the input (48) of a further actuation signal arrangement (41').

27. The method according to claim 26, in which the output (50) of the final actuation signal affangement (41') is connected to a microprocessor (15) as defined in claim 12.

* * * * *